(12) United States Patent
Bass

(10) Patent No.: US 6,624,349 B1
(45) Date of Patent: Sep. 23, 2003

(54) HEAT OF FUSION PHASE CHANGE GENERATOR

(75) Inventor: John C. Bass, La Jolla, CA (US)

(73) Assignee: Hi-Z Technology, Inc., San Diego, CA (US)

(*) Notice: Subject to any disclaimer, the term of this patent is extended or adjusted under 35 U.S.C. 154(b) by 0 days.

(21) Appl. No.: 09/708,396

(22) Filed: Nov. 8, 2000

(51) Int. Cl.[7] .................. H01L 35/30; H01L 35/00; H01L 35/02
(52) U.S. Cl. .................. 136/205; 136/242; 136/207
(58) Field of Search .................. 136/205, 207, 136/242, 204

(56) References Cited

U.S. PATENT DOCUMENTS 4,251,291 A    2/1981 Gomez ............... 136/206
5,761,909 A  * 6/1998 Hughes et al. .......... 62/3.7
6,459,757 B1 * 10/2002 Lacey .................. 378/19

* cited by examiner

Primary Examiner—Patrick Ryan
Assistant Examiner—Thomas H. Parsons
(74) Attorney, Agent, or Firm—John R. Ross; John R. Ross, III

(57) ABSTRACT

A heat of fusion thermoelectric generator. A heat source is in thermal contact with a phase change material, wherein the heat source is capable of providing sufficient heat so as to be able to melt the phase change material. The phase change material is in thermal contact with a hot side heat sink. At least one thermoelectric module is disposed between and in thermal contact with the hot side heat sink and a cold side heat sink. Electric power is generated by the thermoelectric module from a temperature difference between the hot side heat sink and the cold side heat sink.

7 Claims, 4 Drawing Sheets

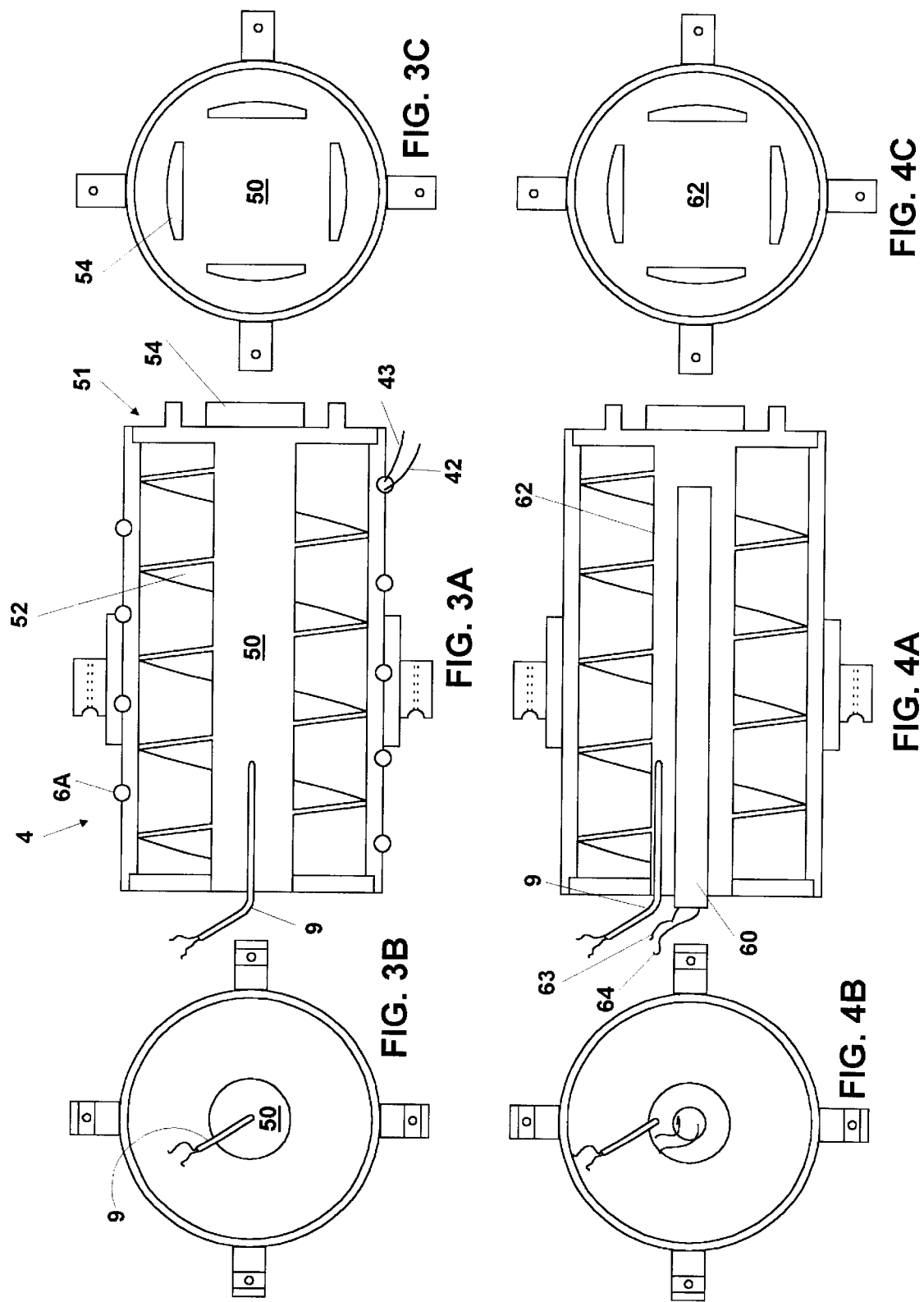

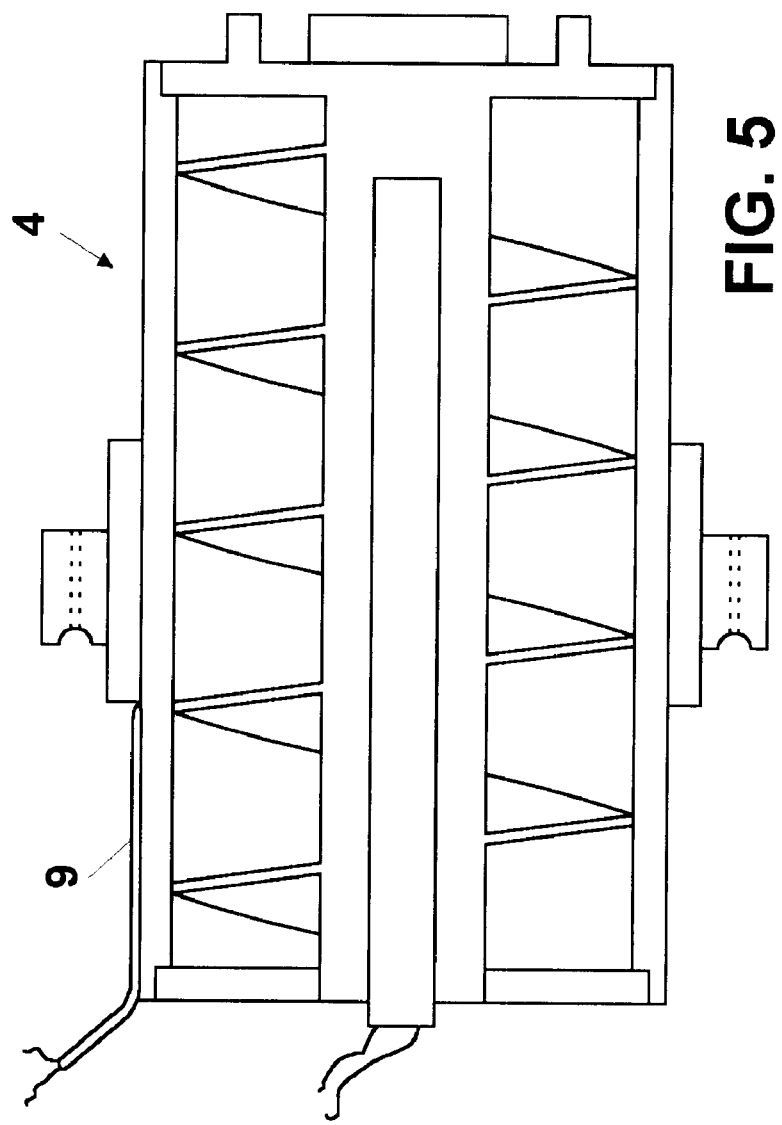

HEAT OF FUSION PHASE CHANGE GENERATOR

This invention relates to thermoelectric generators and in particular to backup thermoelectric generators. This invention was made with Government support under grant DAAE 30-00-C-1018 awarded by the Department of the Army. The Government has certain rights in this invention.

BACKGROUND OF THE INVENTION

A very large number of portable electronic devices are becoming available to people throughout the world. Better integrated circuits have greatly reduced the electric energy required to operate these devices and rechargeable batteries are available to power these devices. However, sometimes such recharging is inconvenient or impossible.

Thermoelectric generators are well known. These devices utilize the physics principal known as the Seebeck effect discovered in 1821. If two conductors of different materials such as copper and iron are joined at their ends forming two junctions, and one junction is held at a higher temperature than the other junction, a voltage difference will arise between the two junctions. Most thermoelectric generating devices currently in use today utilize semiconductor materials, such as bismuth telluride, which are good conductors of electricity but poor conductors of heat. These semiconductors are typically heavily doped to create an excess of electrons (n-type) or a deficiency of electrons (p-type). An n-type semiconductor will develop a negative charge on the cold side and a p-type semiconductor will develop a positive charge on the cold side. Since each element of a semiconductor thermoelectric device will produce only a few millivolts it is generally useful to arrange the elements in series so as to produce higher voltages. Several techniques have been developed for arranging the semiconductor elements in series in thermoelectric devices. One such method is to use a so-called eggcrate design where a small eggcrate-shaped structure made of insulating material separates the thermoelectric elements and permits the elements to be connected in series in an automated fabrication process to reduce the cost of fabricating these modules and improve reliability. Modules of this design are described in U.S. Pat. No. 5,892,656. That patent is incorporated herein by reference. Such modules (HZ-2) are commercially available from Hi-Z Corporation with offices in San Diego, Calif. The dimensions of the module are 1.15 inches×1.15 inches×.20 inch, and the module comprises a 14×14 array of thermoelectric elements. With a 200° C. (360° F.) temperature difference, it will deliver an open circuit voltage of 6.6 volts and has a design operating range of 2.5 to 4.5 volts with an energy conversion efficiency of 5 %.

The heat required to be removed from a material to produce a phase change from a liquid to a solid is called the heat of fusion or latent heat. One of the best known examples is water that requires a removal of 334 joules/gram (144 BTU/lb.) to make the phase changed from water to ice. This is a reversible process that the same amount of heat must be added to go from the solid to the liquid state as must be removed to go from the liquid to the solid state.

Gomez, U.S. Pat. No. 4,251,291 discloses an electric generation system in which solar energy irradiates upon a latent heat storage device to enable the heat to be stored at a relatively constant temperature to serve as the source of heat for a thermoelectric generator. The Gomez device has limited solar applications.

Rechargeable Batteries

It is known in the prior art to connect a rechargeable chemical battery to an electric circuit that is powering an electronic device. If the normal source of electricity fails, the charged chemical battery can provide electricity to the electronic device, for as long as the chemical battery is able to maintain its charge. However, there are significant problems with using a rechargeable chemical battery as a backup power source. For example, rechargeable chemical batteries tend to be very temperature sensitive and will operate poorly at high or low ambient temperatures. Also, rechargeable chemical batteries have a limited shelf life. For example, if left on the shelf too long the chemicals inside the battery can migrate causing battery degradation. Also, rechargeable chemical batteries can only be recharged a relatively small number of times before the battery is unable to hold any further charges.

What is needed is a more reliable backup source of energy.

SUMMARY OF THE INVENTION

The present invention provides a heat of fusion thermoelectric generator. A phase change material in the generator provides a thermal energy source and the thermal energy is converted into electric energy with a thermoelectric module. The phase change material is melted using an external source of energy. The phase change material is in thermal contact with a hot side heat sink. At least one thermoelectric module is disposed between and in thermal contact with the hot side heat sink and a cold side heat sink. Electric power is generated by the thermoelectric module from a temperature difference between the hot side heat sink and the cold side heat sink.

BRIEF DESCRIPTION OF THE DRAWINGS

FIGS. 3A–3C show a preferred embodiment of the heat source capsule.

FIGS. 4A–4C show another preferred embodiment of the heat source capsule.

FIG. 5 shows another preferred embodiment of the present invention.

DETAILED DESCRIPTION OF PREFERRED EMBODIMENTS

Determination of a Preferred Compound with the Ideal Phase Change Range Different compounds were tested while searching for a compound that underwent a phase change at a temperature of interest to a BiTe thermoelectric generator. For a BiTe thermoelectric system, this temperature range is between approximately 250° C. and 350° C. It was also preferable to find a compound that was stable and had a relatively high heat of fusion to minimize the mass of material required to provide the desired thermoelectric output for the desired time (approx. 300 mW for approx. 4 hours).

Table A presents the results of the search for the compound in the 250° C.–350° C. range. This table presents the compound, its melting point, the heat of fusion, molecular weight, and a calculation of the mass of material required to produce 300 mW of output from a bismuth telluride thermoelectric system for a period of four hours (i.e., 1.2 watt-hours).

TABLE A

| Compound | Melting Point (° C.) | Heat of Fusion (Kcal/mol) | Molecular Weight (g/mole) | Mass Required for 1.2 Watt-hours (g) |
|---|---|---|---|---|
| $As_4O_6$ | 278 | 8.0 | 395.68 | 1,224.7 |
| Bi | 271.3 | 2.6 | 209.98 | 1,990.3 |
| $Bi_2S_3$ | 310 | 8.9 | 117.8 | 327.7 |
| $C_5OH$ | 315 | 1.09 | 149.91 | 3,405.6 |
| $CaCl_2 \cdot H_2O$ | 260 | 6.8 | 129 | 469.7 |
| $Cd(NO_3)_2$ | 350 | 7.8 | 236.41 | 750.5 |
| $FeCl_3$ | 304 | 10.3 | 162.21 | 390.0 |
| $HgCl_2$ | 277 | 4.64 | 271.52 | 1449.0 |
| $HgI_2$ | 259 | 4.53 | 454.45 | 2,484.1 |
| KOH | 360.4 | 2.06 | 56.11 | 674.5 |
| $NaClO_3$ | 248–261 | 5.4 | 106.44 | 488 |
| $NaNO_2$ | 271 | 11.4 | 69 | 149.9 |
| $NaNO_3$ | 308 | 3.6 | 85.01 | 584.7 |
| NaOH | 318.4 | 1.58 | 40 | 626.9 |
| RbOH | 300 | 1.62 | 102.49 | 1,566.6 |
| $RbNO_3$ | 310 | 1.34 | 147.47 | 2,725.1 |
| $Tl_2CO_3$ | 272 | 4.4 | 468.57 | 2,236.9 |
| TeF | 327 | 9.0 | 223.38 | 614.6 |
| TlF | 322 | 3.3 | 223.39 | 1,676.2 |
| $WBr_5$ | 276 | 4.10 | 583.37 | 3,523.3 |
| $WCl_5$ | 248 | 4.9 | 361.12 | 1,825.3 |
| $WCl_6$ | 275 | 1.6 | 396.57 | 6,137.4 |
| $ZuCl_2$ | 283 | 2.45 | 136.29 | 1,377.5 |

The mass calculation shown in Table A assumes a thermoelectric conversion efficiency of approximately 5% and approximately a 20% extraneous heat loss via heat transport through the insulation. These values are consistent with the operation of a bismuth telluride module with a 200° C. differential temperature across the module and a generator with an inert gas multi-foil insulation system similar to that shown in FIG. 1 and described below.

Based on the criteria described above and the results depicted in Table A, it was determined that a preferred phase change material would be sodium nitrite ($NaNO_2$). 149.9 grams of sodium nitrite at its phase change temperature of 271° C. will provide approximately 4 hours of 300 milliwatts of power (assuming a 200° C. temperature differential across module 8).

First Preferred Embodiment

Figure 1:
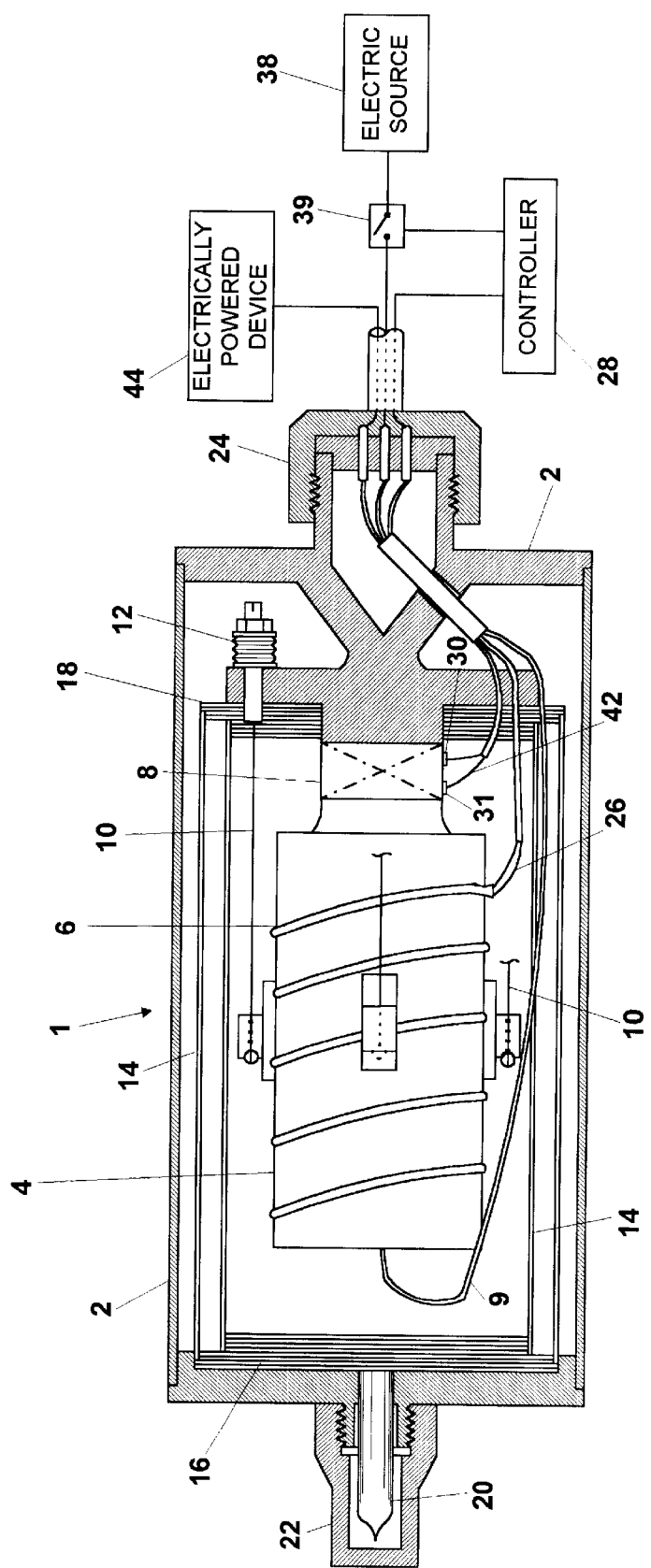
FIG. 1 shows a preferred embodiment of the present invention.

A first preferred embodiment of the present invention is shown in FIG. 1. The internal components of heat of fusion thermoelectric generator 1 are preferably contained within aluminum pressure shell 2. In the first preferred embodiment, the diameter of pressure shell 2 is approximately 2.5 inches and its length is approximately 6 inches. Filled with approximately 150 grams of sodium nitrite ($NaNO_2$), thermoelectric generator 1 should weight approximately 0.75 pounds. The dimensions and weight of thermoelectric generator 1 make it pocket portable.

Heat source capsule 4 is a cylindrical container approximately 1.5 inches long. Stored inside of heat source capsule 4 are 150 grams of sodium nitrite ($NaNO_2$). The properties of sodium nitrite are disclosed in Table A. Heating coil 6 is wrapped around heat capsule 4. Thermocouple 9 is attached to heat source capsule 4 and functions to sense the temperature of the sodium nitrite. Heat source capsule 4 is held against thermoelectric module 8 by four tie wires 10, each of which is tensioned by Belleville spring stack and nut assembly 12. Utilization of Belleville springs 12 will help minimize temperature drops at the thermal interfaces and will also allow the generator to withstand high shock loads.

Insulation

A multifoil type of thermal insulation system is located between heat source capsule 4 and pressure shell 2. Two cylinders of aluminized Kapton® foils 14 (Kapton® is a trademark of Dupont Corp. and is used to describe a well-known polyimide material) provide radial insulation as shown. Likewise, aluminized Kapton® disks 16 and 18 form the axial insulation. The aluminized foils minimize radiation heat transfer since the foil surfaces are highly reflective and have low emissivity.

After the components have been installed inside pressure shell 2, the void space within pressure shell 2 is evacuated and then backfilled with one atmosphere Xenon or another inert gas such as argon. Xenon is preferred because it has the lowest known thermal conductivity of any known gas. The chamber is then sealed via pinch off tube 20. Protective cap 22 covers pinch off tube 20.

It will be obvious to those skilled in the art that other insulation systems such as semi-rigid MIN-K or fibrous mineral insulation such as FIBERFRAX can also be used. (MIN-K is a registered trademark of the Johns-Manville Corporation with offices in New York, New York and refers generally to thermal insulation used particularly in high temperature applications. FIBERFRAX is a registered trademark of the Carborundum Corporation with offices in Cleveland, Ohio and refers generally to thermal insulation utilizing loose masses of refractory fibers.) These systems would require a back fill with a gas such as argon or nitrogen. In this embodiment, the size of pressure shell 2 may be slightly larger to achieve similar thermal performance.

Another insulation system that incorporates a larger number of reflecting foils than that shown in the preferred embodiment and that is used with an evacuated system could also be used to achieve the desired degree of thermal insulation. Such a system may be more efficient than that shown in the preferred embodiment, but it would likely be more expensive to produce and more prone to failure.

Operation of the First Preferred Embodiment

To melt the phase change material located in heat source capsule 4, electric current is supplied to heating coil 6. As shown in FIG. 1, electrical current from electric source 38 travels through plug 24 then through conductor 26 to heating coil 6. Thermocouple 9 senses the temperature of the phase change material inside heat source capsule 4. In accordance with the phase change material's heat of fusion, the temperature sensed by thermocouple 9 will level off when the phase change material reaches its melting point. For sodium nitrite, the melting point is approximately 271° C.

In a preferred embodiment, controller 28 is programmed to trip switch 39 so that electricity from electric source 38 is cut-off, thereby deactivating heating coil 6 when the sensed temperature is greater than the preset value (i.e., slightly above the melting point). Likewise, when the sensed temperature is slightly below the melting point, controller 28 will close switch 39 and electricity will once again flow to heating coil 6. For example, for sodium nitrite with a melting point of 271° C., heating coil 6 will deactivate at 275° C. and reactivate at 267° C.

Electricity Generation

Figure 2:
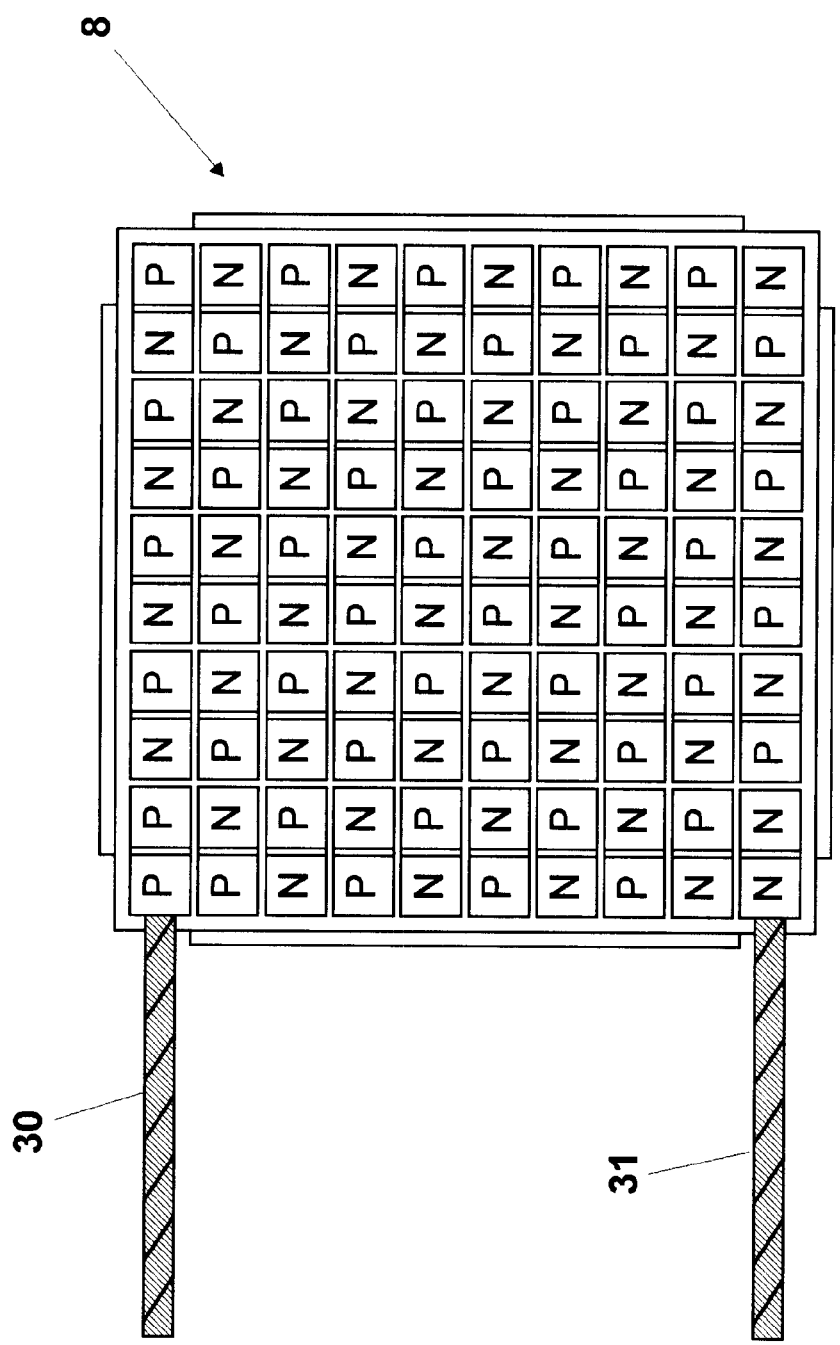
FIG. 2 shows a preferred thermoelectric module.

As the phase change material inside heat source capsule 4 is heated, approximately 80% of the heat from heat source capsule 4 will pass through thermoelectric module 8. Heat flowing through thermoelectric module 8 causes electric power to be produced. FIG. 2 shows a detailed top view of a preferred thermoelectric module 8 with electric leads 30 and 31. In a preferred embodiment, thermoelectric module 8 is approximately 0.75 inches square and 0.4 inches thick. It contains a 10×10 array of N and P type bismuth telluride elements that are approximately 0.05 inches square and 0.357 inches long. A preferred thermoelectric module 8 will utilize the gapless eggcrate construction described in U.S. Pat. No. 5,892,656. The 10×10 array shown in FIG. 2 is similar to the 10×10 array described in the patent. It will produce 300 milliwatts of power and 1.65 Volts at matched load when subject to a differential temperature of 200° C. It should be noted that in the first preferred embodiment the design of thermoelectric module 8 was selected to match the voltage requirements of a light emitting diode (LED) and that the voltage can be altered to fit other applications by changing the number of series connected thermoelectric elements in the module.

Electricity generated by thermoelectric module 8 flows through output power wire 42, through plug 24 and to electrically power device 44. If electricity from electric source 38 is cut-off, either by controller 28 tripping switch 39 or due to failure of electric source 38, electric power will continue to be supplied to electrically powered device 44 so long as there is a temperature differential across thermoelectric module 8.

For example, assume sodium nitrite ($NaNO_2$) is the phase change compound inside heat source capsule 4. As shown in Table A, the melting point of sodium nitrite is 271° C. In a preferred embodiment, the temperature of the sodium nitrite in a fully charged state is slightly greater than its melting point (for example, approximately 276° C.). Fully charged, the sodium nitrite is all liquid. After electricity has been removed from heating coil 6, the temperature of the sodium nitrite will decrease reasonably rapidly until the phase change temperature of the compound is reached. The temperature of the compound will then remain constant (i.e., approximately 271° C.) until the entire compound has given up its heat of fusion and changed phase to a solid. The temperature will again decrease rapidly as the solid cools and gives up its heat capacity. As shown in Table A, approximately 150 grams of sodium nitrite at its phase change temperature of 271° C. will provide approximately 4 hours of 300 milliwatts of power (assuming a 200° C. temperature differential across module 8).

Heat Source Capsule

Metallic Clad Sheathed Heater

A preferred embodiment of heat source capsule 4 is shown in FIGS. 3A–3C. In this embodiment heating coil 6 (shown in FIG. 1) is a metallic clad sheathed heater 6A brazed in a helical groove machined to the outside of heat source capsule 4. In the first preferred embodiment, the two heating elements are contained in the same sheath. Therefore, only a single helix groove is required. Both external electrical connection connections to the heater (wires 42 and 43) are made at one end of heating coil 6. The two heating elements are connected together inside the sheath at the other end of heating coil 6.

Preferably, metallic clad sheathed heater 6 A is fabricated by first fitting an electric insulator (for example, MgO) over the two heating elements. The assembly is then fed into a metal sheath, and the entire assembly is then swaged to the desired dimension. Done properly, this will result in electric isolation of the two heating elements from the metal sheath and from each other while maintaining good heat transfer characteristics between the heating elements and the sheath.

Heat source capsule 4 contains solid metal heat transfer piece 50 that is positioned along its centerline and is attachable at end 51 to the hot side of a thermoelectric module. Preferably, heat transfer piece 50 is aluminum and is circular in cross section. Helical fin 52 aids in heat transfer from the phase change material to the heat transfer piece and is orientated in a perpendicular fashion to heat transfer piece 50. Thermocouple 9 is fitted alongside heat transfer piece 5. Thermoelectric module locating ears 54 aid in properly positioning the thermoelectric module next to heat transfer piece 50.

Another preferred embodiment of heat source capsule 4 is shown in FIGS. 4A–4C. In this preferred embodiment, metallic clad sheathed heater 60 is inserted inside heat transfer piece 62. Power leads 63 and 64 exit metallic clad sheathed heater 60. Preferably, thermocouple 9 is placed off-center heat transfer piece 62.

Another preferred embodiment of the present invention is shown in FIG. 5. This embodiment is similar to the embodiment shown in FIGS. 4A–4C with the exception that thermocouple 9 is attached directly to the outside of heat source capsule 4.

Advantages of the Present Invention

The present invention has several advantages. It has virtually an infinite shelf life. It can be recharged a very large number of times compared to a chemical rechargeable battery. It is unaffected by normal storage conditions. It can be charged rapidly. For example, with an electric source providing 500 watts to heating coil 6 (FIG. 1), 150 grams of sodium nitrite inside heat source capsule 4 should take approximately four to five minutes to melt and be ready for full power operations. Also, there is only a slight loss in peak power under high normal ambient operating temperatures (T approximately equal to 120° F.) and there is a slight increase in peak power at low ambient operating temperatures (T approximately equal to −40° F.).

A Preferred Application for the First Preferred Embodiment

One of ordinary skill in the art will recognize many possible applications for the first preferred embodiment. A preferred application for heat of fusion thermoelectric generator 1 shown in FIG. 1 is as a backup power source to provide electricity to illuminate the gun sight mechanism of a military weapons system. In this application, it is very important that the backup power source be rapidly rechargeable, reliable, and not subject in a major way to extremes of ambient temperature.

While the above description has dealt with preferred embodiments of the present invention, the reader should understand that many modifications could be made and still be within the scope of the invention. For example, although FIGS. 3A–3C showed metallic clad sheathed heater 6 A with two heating elements in the same sheath, those of ordinary skill in the art will recognize that it is possible to use a heater where there is just one heating element in the sheath. If a heater of this fashion is utilized, then a double helix groove would be machined to the outside of heat source capsule 4 so that both lead wire connections end up at the same end of heat source capsule 4. This embodiment would require a circular groove at the opposite end of the helix to connect the two helix grooves in order to return the heater down the second helical to the starting end. Also, it will be obvious to those of ordinary skill in the art that there are many other ways of heating and melting the phase change material. For example, it would be possible to heat and melt the phase change material by utilizing a heat pipe, which is a solid metallic conductor. By conducting the heat from the heat source to the phase change material, the use of the heat pipe will allow the phase change material to be heated by sources other than electric. For example, an open fire, exhaust heat from an internal combustion engine, or other heat sources that are of sufficient temperature to melt the phase change material could heat the phase change material. Therefore, the attached claims and their legal equivalents should determine the scope of the invention.

I claim:

1. A heat of fusion thermoelectric generator, comprising:
   A) a hot side heat sink,
   B) a phase change material in thermal contact with said hot side heat sink,
   C) an electric heat source in thermal contact with said phase change material, wherein said heat source provides sufficient heat to melt said phase change material,
   D) a cold side heat sink, and
   E) at least one thermoelectric module, disposed between and in thermal contact with said hot side heat sink and said cold side heat sink, wherein electric power is generated by said at least one thermoelectric module from a temperature difference between said hot side heat sink and said cold side heat sink.

2. The heat of fusion thermoelectric generator as in claim 1, wherein said heat source is at least one electrically powered heating element.

3. A heat of fusion thermoelectric generator, comprising:
   A) a hot side heat sink,
   B) a phase change material in thermal contact with said hot side heat sink,
   C) a heat source in thermal contact with said phase change material, wherein said heat source provides sufficient heat to melt said phase change material,
   D) a cold side heat sink,
   E) at least one thermoelectric module, disposed between and in thermal contact with said hot side heat sink and said cold side heat sink, wherein electric power is generated by said at least one thermoelectric module from a temperature difference between said hot side heat sink and said cold side heat sink, and
   F) a thermocouple in thermal contact with said phase change material, for sensing the temperature of said phase change material.

4. The heat of fusion thermoelectric generator as in claim 3, further comprising:
   A) a source of electricity,
   B) an electrically powered heat source, powered by said source of electricity,
   C) a controller electrically connected to said thermocouple and said source of electricity, wherein said controller is for deactivating said source of electricity after receiving an electric signal from said thermocouple that indicates said phase change material has completely melted, wherein said controller is for reactivating said source of electricity after receiving an electric signal from said thermocouple that indicates said phase change material has completely solidified,
   D) an electronic device, and
   E) an electric circuit for providing power from said at least one thermoelectric module to operate said electronic device.

5. A heat of fusion thermoelectric generator, comprising:
   A) a hot side heat sink,
   B) a phase change material in thermal contact with said hot side heat sink,
   C) a electrically powered heat source in thermal contact with said phase change material, wherein said heat source provides sufficient heat to melt said phase change material,
   D) a cold side heat sink,
   E) at least one thermoelectric module, disposed between and in thermal contact with said hot side heat sink and said cold side heat sink, wherein electric power is generated by said at least one thermoelectric module from a temperature difference between said hot side heat sink and said cold side heat sink, and
   F) a heat source capsule for containing said phase change material.

6. The heat of fusion thermoelectric generator as in claim 5, wherein said hot side heat sink is a heat transfer piece contained within said heat source capsule, wherein said heat transfer piece is in thermal contact with said phase change material and said at least on thermoelectric generator.

7. A heat of fusion thermoelectric generator, comprising:
   A) a hot side heat sink,
   B) a phase change material in thermal contact with said hot side heat sink,
   C) a heat source in thermal contact with said phase change material, wherein said heat source provides sufficient heat to melt said phase change material,
   D) a cold side heat sink,
   E) at least one thermoelectric module, disposed between and in, thermal contact with said hot side heat sink and said cold side heat sink, wherein electric power is generated by said at least one thermoelectric module from a temperature difference between said hot side heat sink and said cold side heat sink,
   F) a pressure shell, wherein the internal components of said heat of fusion thermoelectric generator are contained within said pressure shell, and
   G) insulation disposed inside said pressure shell, said insulation comprising:
      1) at least two cylinders of aluminized polyimide foils for radial insulation,
      2) at least two polyimide disks for axial insulation, and
      3) an inert gas contained within said pressure shell.

* * * * *